United States Patent [19]

Lehman-Lamer

[11] Patent Number: 4,963,225

[45] Date of Patent: Oct. 16, 1990

[54] METHOD OF FABRICATING A CONTACT DEVICE

[75] Inventor: Gail R. Lehman-Lamer, Hillsboro, Oreg.

[73] Assignee: Tektronix, Inc., Beaverton, Oreg.

[21] Appl. No.: 424,467

[22] Filed: Oct. 20, 1989

[51] Int. Cl.⁵ .................. B44C 1/22; C03C 15/00; C23F 1/00
[52] U.S. Cl. ..................... 156/630; 156/634; 156/643; 156/644; 156/652; 156/656; 156/659.1; 156/668; 204/15; 324/158 P; 437/183
[58] Field of Search ............... 156/630, 634, 643, 644, 156/652, 655, 656, 659.1, 668, 902; 204/15; 437/180, 182, 183, 209, 220; 324/158 P

[56] References Cited

U.S. PATENT DOCUMENTS

| | | | |
|---|---|---|---|
| 3,838,984 | 10/1974 | Crane et al. | 174/52 PE |
| 4,585,991 | 4/1986 | Reid et al. | 156/647 X |
| 4,676,864 | 6/1987 | Maeda et al. | 156/668 X |
| 4,740,700 | 4/1988 | Shaham et al. | 156/902 X |
| 4,878,990 | 11/1989 | Dugan et al. | 156/902 X |

*Primary Examiner*—William A. Powell
*Attorney, Agent, or Firm*—John D. Winkelman; John Smith-Hill

[57] ABSTRACT

A contact element is formed on a sheet of dielectric material by depositing conductive material in an opening in a first layer of dielectric material, and depositing a second layer of dielectric material over the first layer and over the conductive material in the opening. Material of the first layer is removed from the surface farther from the second layer so that the conductive material projects beyond the first layer.

6 Claims, 2 Drawing Sheets

METHOD OF FABRICATING A CONTACT DEVICE

BACKGROUND OF THE INVENTION

This invention relates to a method of fabricating a contact device.

It is known to test an integrated circuit having an array of connection pads at the wafer stage of fabrication, i.e., before dicing into separate chips, using a flexible wafer probe, comprising a sheet of polyimide having contact bumps projecting from one surface thereof in an array corresponding to the array of connection pads of the integrated circuit. The contact bumps are connected to a measurement instrument through strip-form signal lines deposited on the polyimide sheet.

A known method of fabricating a wafer probe is illustrated in FIGS. 1A-1C of the accompanying drawings. A polyimide sheet 2 (FIG. 1A) has a copper substrate 4 bonded to its back surface. A layer 6 of plate-up base is deposited over the front surface 8 of sheet 2 by electron beam evaporation. Layer 6 may comprise successive films of titanium, palladium and gold. Layer 6 is patterned and a layer of gold is deposited electrolytically on the portions of layer 6 that remain, forming contact bases 8 and signal runs 10. A thick layer 14 (FIG. 1B) of photoresist is deposited over the surface of sheet 2 and is exposed to actinic radiation in accordance with the pattern of contact bases 8. The photoresist is developed and the resist that was exposed is removed, forming holes 16 through which the contact bases are exposed. Nickel is deposited electrolytically into holes 16 to form contact bumps 18 (FIG. 1C) bonded to contact bases 8, and the photoresist is stripped. The copper substrate is thinned, and is then patterned and etched to the configuration desired for a ground plane.

The fabrication process described with reference to FIGS. 1A-1C is subject to disadvantage. Since layer 14 is quite thick, it is difficult to ensure that all photoresist overlying contact bases 8 is removed after exposure and development of the photoresist, and consequently the nickel contact bumps normally do not contact the entire area of their respective gold contact bases. Consequently, the strength of the bond between the contact bumps and the respective contact bases is impaired. The holes formed in layer 14 do not have vertical sides, and therefore the bodies of nickel that are deposited into the holes to form the contact bumps are not cylindrical but tend to have a mushroom configuration and to be non uniform in height. In order to ensure reliable contact between the bumps and the connection pads of the circuit under test, the bumps are ground to a uniform height when the ground plane is in engagement with a planar back-up member. This grinding imposes stresses on the bumps, and frequently the bumps are broken from their contact bases, particularly because of the poor adhesion between the bumps and their bases.

SUMMARY OF THE INVENTION

In accordance with the present invention, a contact element is formed on a sheet of dielectric material by depositing conductive material in an opening in a first layer of dielectric material, and depositing a second layer of dielectric material over the first layer and over the conductive material in the opening. Material of the first layer is removed from the surface farther from the second layer so that the conductive material projects beyond the first layer.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 2A:
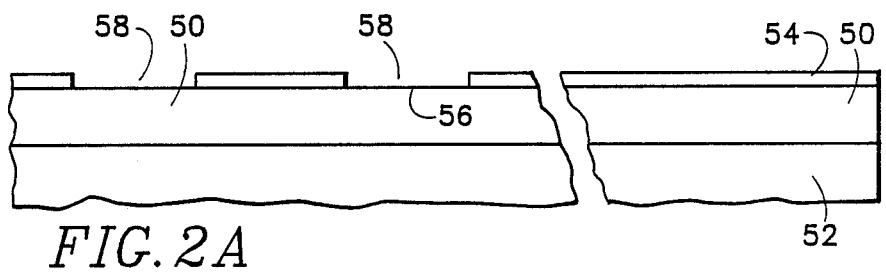
FIGS. 2A-2F show various steps of a method in accordance with the present invention.

FIG. 2A illustrates a sheet 50 of polyimide bonded to a substrate 52 of stainless steel. Sheet 50 is about 25 $\mu$m thick. A layer 54 of aluminum is deposited over the upper surface 56 of layer 50 and is selectively etched using conventional techniques to form holes 58. The structure is then subjected to a reactive ion etching process, which may be carried out in a March Instruments Jupiter II reactive ion etcher, to remove polyimide exposed through holes 58. The pressure in the etcher determines whether the polyimide will be removed isotropically or anisotropically. Preferably, the pressure is adjusted so that the etcher operates at the inflection on the transition between anisotropic and isotropic operation. This was found to be a pressure of 0.64 torr. At this pressure, the polyimide is etched isotropically, resulting in formation of downwardly tapering holes 60 (FIG. 2B) in sheet 50.

The remaining aluminum is then removed using an aluminum etchant, and the structure is placed in a nickel plating bath with substrate 52 connected as cathode. Bodies 66 (FIG. 2C) of nickel are electrolytically deposited in holes 60. Plating continues for a time that is selected to be sufficient to fill holes 60. A layer 68 of plate-up base is deposited by electron beam evaporation over surface 56 of sheet 50. The plate-up base may comprise consecutive films of titanium, palladium and gold. However, it is preferred that the plate-up base comprise consecutive films of chromium and gold. Depending on the nature of layer 68, chemical and/or thermal bonding occurs between layer 68 and surface 56. Good metal-to-metal adhesion is obtained between layer 68 and bodies 66. Layer 68 is then selectively etched (FIG. 2D) so as to remove material of layer 68 except from bodies 66 and where signal runs connected to bodies 66 are required. The resulting structure is placed in a gold plating bath with substrate 52 connected as cathode, and gold is deposited electrolytically onto the remaining portions of layer 68 to form signal runs 70.

Figure 2B:
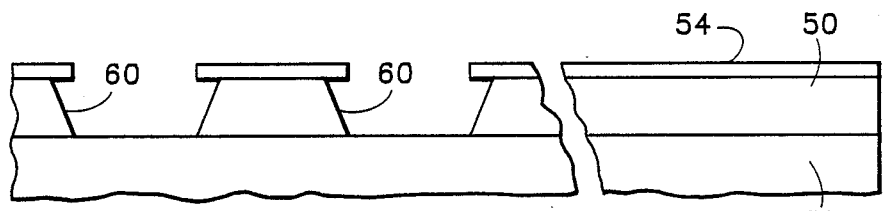
Figure 2C:
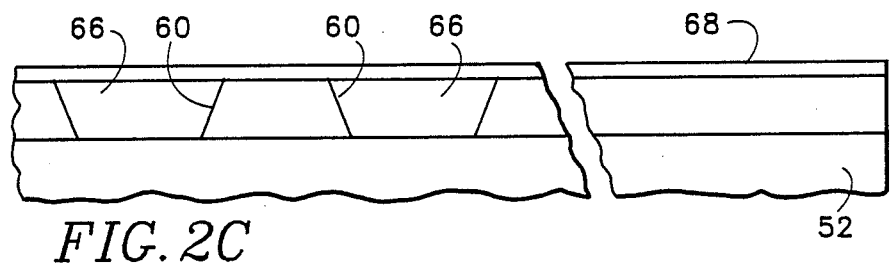
Figure 2D:
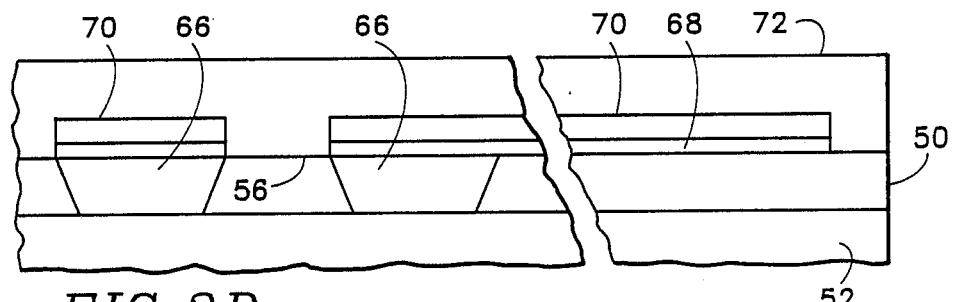
Figure 2E:
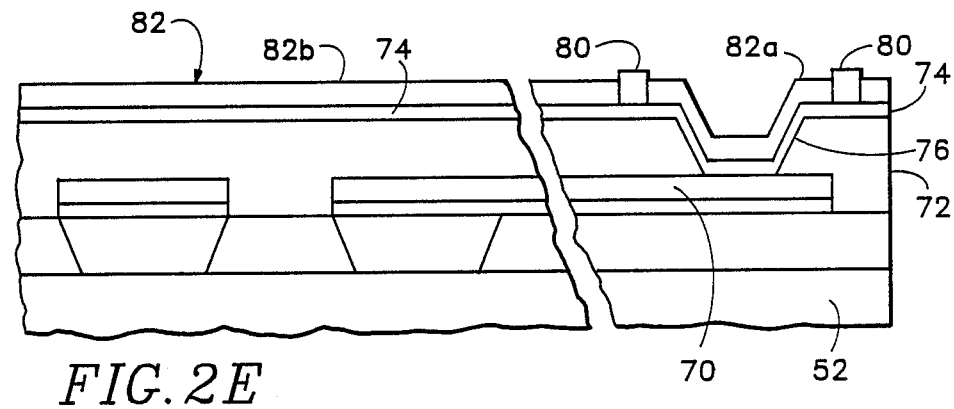

A layer 72 of polyimide is then applied over surface 56 and signal runs 70 and is cured. The sequence of operations described with reference to FIGS. 2A-2C is then repeated, except that the holes 76 (FIG. 2E) formed in polyimide layer 72 are positioned over the outer ends of signal runs 70 and the nickel plating step is omitted so that plate-up base 74 is deposited over the upper surface of layer 72 and into holes 76 and contacts signal runs 70. The tapered configuration of holes 76 avoids step coverage problems with layer 74. A layer of photoresist is deposited over layer 74 and is exposed in accordance with a pattern that includes a ring extending around each hole 76. The photoresist is developed, and the unexposed photoresist is stripped, leaving a ring 80 of photoresist around each hole. The structure is placed in a gold plating bath with substrate 52 connected as a cathode, and a layer 82 of gold is deposited over the exposed plate-up base. Layer 82 comprises interconnect portions 82a surrounded by the rings of photoresist and extending into holes 76 and a ground plane portion 82b. Photoresist rings 80 are then removed, and the plate-up base that is exposed is removed by conventional selective etching techniques, thereby electrically isolating interconnect areas 82a and ground plane portion 82b (FIG. 2F).

Substrate 52 is then selectively etched so as to remove substrate 52 except for a narrow margin 86 around the periphery of sheet 50. The exposed lower surface of sheet 50 is exposed to a reactive ion etching operation, so that the polyimide is etched back and bodies 66 in holes 60 then project beyond the lower surface of sheet 50, forming contact bumps.

Figure 2F:
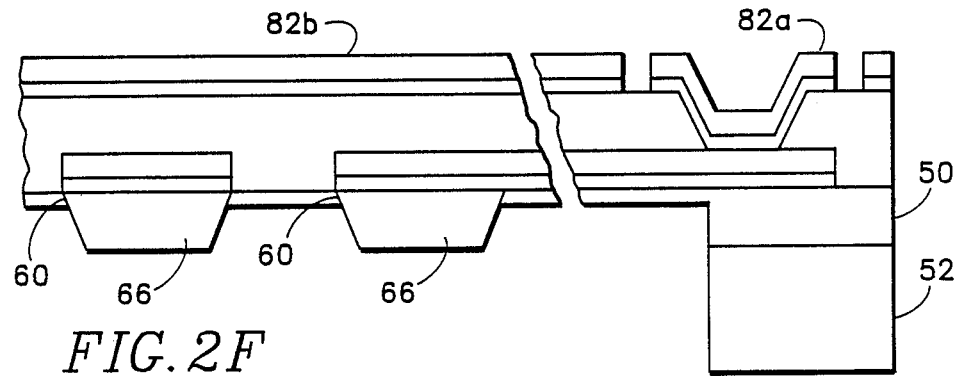

The device shown in FIG. 2F is used to probe an integrated circuit in wafer form. The wafer probe is placed over the wafer, with the contact bumps registering with connection pads of a circuit under test, and the contact bumps are pressed into contact with the connection pads. Contact force is provided by a body of elastomer material engaging the upper surface of the wafer probe.

There is a possibility that the vertical heights of the bodies of nickel will not be equal. In order to ensure reliable contact between the contact bumps and the respective connection pads, the nickel bodies are ground while the upper surface of the wafer probe is supported by a planar back-up member.

Figure 1A:
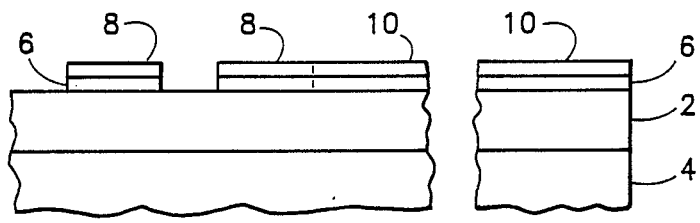
FIGS. 1A-1C show various steps in a known method of fabricating a wafer probe.
Figure 1B:
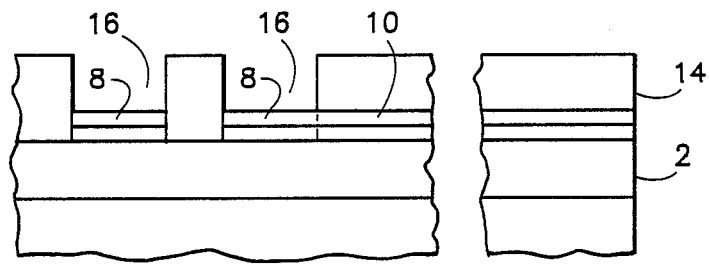
Figure 1C:
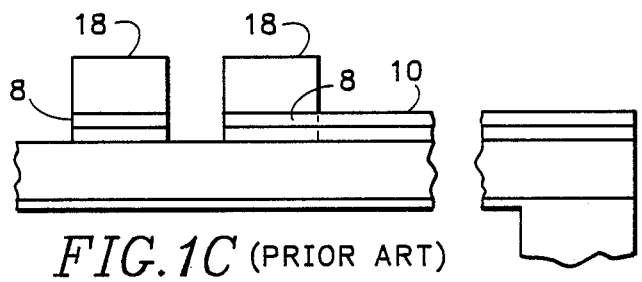

The wafer probe fabricated by the method described with reference to FIGS. 2A-2F is superior to that fabricated by the method described with reference to FIG. 1, because the height of the bumps is controlled by the thickness of layer 50 and the amount of layer 50 that is removed by etching. Accordingly, there is very little variation in height of the bumps, and there is little need for grinding to bring the bumps to uniform height. Further, since plate-up base 68 is deposited directly onto surface 56 and body 66, superior adhesion is obtained between the nickel bumps and the plate-up base, so that if grinding should be necessary it less likely to result in any bumps being broken off. The configuration of the bumps is controlled by the reactive ion etching, and it is possible to adjust the angle of the wedge by changing the pressure in the etcher.

It will be appreciated that the invention is not restricted to the particular embodiment that has been described, and that variations may be made therein without departing from the scope of the invention as defined in the appended claims and equivalents thereof.

I claim:

1. A method of fabricating a contact element on a sheet of dielectric material, comprising:
   (a) providing a first layer of dielectric material having first and second opposite surfaces and at least one opening,
   (b) depositing conductive material in said opening,
   (c) depositing a second layer of dielectric material over the first surface of the first layer and over the conductive material in said opening, and
   (d) removing material of the first layer from its second surface so that the conductive material projects beyond the first layer.

2. A method according to claim 1, wherein step (a) comprises providing a layer of dielectric material, masking a surface of the layer of dielectric material with a mask formed with an opening, and removing material of the layer of dielectric material through the opening in the mask.

3. A method according to claim 2, comprising removing material of the layer of dielectric material by etching.

4. A method according to claim 3, comprising etching under conditions such that the dielectric material is removed isotropically.

5. A method according to claim 1, comprising, between steps (b) and (c), depositing a layer of conductive material over the first surface of the first layer and patterning the layer of conductive material to define portions that are in adhesive relationship with the conductive material in the opening.

6. A method according to claim 1, wherein the layer provided in step (a) is bonded at its second surface to a metal substrate, and the method comprises, between steps (c) and (d), removing the metal of the substrate so as to expose the second surface of the first layer of dielectric material.

* * * * *